| United States Patent [19] | [11] | 4,334,970 |
|---|---|---|
| Lombardi et al. | [45] | Jun. 15, 1982 |

[54] RADIATION CURABLE SOLVENT-FREE COMPOSITIONS RECOVERY SYSTEM

[75] Inventors: Louis J. Lombardi, Roselle; Roy J. Coyne, Hometown, both of Ill.

[73] Assignee: The Richardson Company, Des Plaines, Ill.

[21] Appl. No.: 106,556

[22] Filed: Dec. 26, 1979

Related U.S. Application Data

[60] Division of Ser. No. 739,183, Nov. 5, 1976, Pat. No. 4,201,842, which is a continuation of Ser. No. 405,407, Oct. 11, 1973, abandoned.

[51] Int. Cl.$^3$ .......................... C08F 2/50; C08J 3/28; C08K 5/03; C08L 29/08
[52] U.S. Cl. .......................... 204/159.15; 204/159.18; 525/194; 525/213; 525/231; 525/257; 525/298
[58] Field of Search ...................... 525/59; 204/159.14, 204/159.15; 260/28.5 R

[56] References Cited

U.S. PATENT DOCUMENTS

| B 530,873 | 2/1976 | Rosenkranz et al. | 204/159.15 |
|---|---|---|---|
| 2,902,365 | 9/1956 | Martin | 204/159.15 |
| 3,551,246 | 12/1970 | Bassemir et al. | 204/159.15 |
| 3,551,311 | 12/1970 | Bassemir et al. | 204/159.15 |
| 3,832,421 | 8/1974 | Morgan | 204/159.14 |
| 3,839,171 | 10/1974 | Akamatsu et al. | 204/159.15 |
| 3,843,572 | 10/1974 | Morgan | 204/159.15 |
| 3,876,519 | 4/1975 | McGinniss | 204/159.24 |
| 3,876,579 | 4/1975 | Hallstrom et al. | 260/37 EP |

*Primary Examiner*—John C. Bleutge
*Assistant Examiner*—A. H. Koeckert
*Attorney, Agent, or Firm*—Lockwood, Dewey, Alex & Cummings

[57] ABSTRACT

An improved photosensitive resin system being essentially solvent-free which contains an ester produced from an unsaturated organic acid and a polyhydroxyl containing material, a photoinitiator, a carbonyl initiator, and a monomer capable of reacting with an acrylic monomer, wherein an improvement comprises an additional component comprising an unsaturated hydroxyl containing polymer hydrocarbon. The improved composition has curing rates far in excess of those systems not using the hydroxyl containing unsaturated polymer. In particular, the advantages obtained through the use of the additional component are much faster curing of the composition, exceptional gloss, toughness, abrasion resistance and good rub resistance.

9 Claims, No Drawings

4,334,970

RADIATION CURABLE SOLVENT-FREE COMPOSITIONS RECOVERY SYSTEM

This is a division of application Ser. No. 739,183, filed Nov. 5, 1976, now U.S. Pat. No. 4,201,842 which, in turn, is a continuation of application Ser. No. 405,407, filed on Oct. 11, 1973, now abandoned.

BACKGROUND OF THE INVENTION

1. Field of the Invention

The field of art to which this invention pertains is radiation curable compositions. In particular, this invention relates to radiation curable solventless ink compositions.

2. Description of the Prior Art

Typical of this prior art is U.S. Pat. No. 3,551,311 issued Dec. 29, 1970, having Nass, Bassemir and Carlick as co-inventors. That patent relates to a radiation curable solvent-free composition which consists essentially of an ester produced from the reaction of an ethylenically unsaturated acid and a polyhydric alcohol, and a photoinitiator comprising a halogenated aromatic alicyclic or aliphatic hydrocarbon initiator. These two components which combined in weight ratios is taught by the patent produce a radiation curable composition possessing particular useful characteristics. Such materials may be incorporated into coatings used on metals, plastics, textiles, paper, cardboard, or as a marking composition for roads, airfields or similar surfaces.

However, the rather simple two-component system described above does have certain limitations. The primary difficulty with such a photoreactive system has been rather poor gloss and wet rub resistance of the cured composition. Additionally, the toughness of such systems after curing has been found to be poor in many instances.

The present novel improvement eliminates such deficiencies by the addition to such prior art systems of a vinyl and hydroxyl containing polymer and in particular a polymer of a vinyl aromatic and an unsaturated alcohol. Such polymer improves the wet rub resistance, gloss and toughness of the cured system making such systems a practical coating which can be used in the printing industry.

SUMMARY OF THE INVENTION

Our invention can be summarized as an improved photosensitive resin system being essentially solvent-free and comprising an ester, a photoinitiator comprising a halogenated hydrocarbon, and a carbonyl initiator, wherein an improvement comprises adding an unsaturated hydroxyl containing polymeric hydrocarbon, to the mixture.

In a broad embodiment our invention resides in an improved photosensitive resin system being essentially solvent-free comprising: (a) at least one ester of an unsaturated acid and a polyhydric alcohol; (b) a photoinitiator comprising a hydrocarbon (c) a viscosity control agent comprising a vinyl monomer capable of reacting with an acrylic monomer; wherein said improvement comprises the following additional components comprising an unsaturated hydroxyl containing polymeric hydrocarbon material.

DETAILED DESCRIPTION OF THE INVENTION

Photopolymerizable systems generally comprise a photoinitiator and a vehicle as the two basic components of such systems.

The photoinitiator is a substance which initiates the polymerization of the vehicle. It generally breaks down upon exposure to radiation generating free-radicals which act upon the vehicle causing polymerization thereof. The photoinitiator used in such systems may be replaced by and also contain materials defined as sensitizers or cabonyl initiators. More specifically the sensitizers render the photoinitiators responsive to a broader range of radiation thereby increasing the sensitivity of the photopolymerizable system to radiation and rendering polymerization of the vehicle more easily performed. In many instances sensitizers also perform in essentially the same manner as the photoinitiators, breaking down upon exposure to radiation forming free-radicals which themselves cause polymerization of the vehicle system. In such cases the term "photoinitiator" can include sensitizers alone or in combination with other materials which perform the function of a photoinitiator as described above.

The photoinitiators used in the present system preferrably should be essentially solvent-free. One of the primary purposes of utilizing the present system is to substantially eliminate emissions of solvents to the atmosphere by utilizing a system which can be polymerized with substantially no emission of volatile materials upon polymerization.

The second basic component of such a photosensitive resin system is the vehicle portion. The vehicle generally contains a polymerizable compound which upon exposure to the free-radicals generated by the photoinitiator becomes polymerized forming a relatively hard and permanently set material. The vehicle must be a solventless containing material to prevent emissions of vapors to the atmosphere when the vehicle is polymerized. The vehicle generally comprises vinyl containing esters as one of the materials which polymerize when in contact with the free-radicals generated by the photo-initiator. The vehicle, in addition to containing the above described polymerizable compounds, should also contain a viscosity control agent which also can polymerize when free-radicals are generated by the photoinitiator after exposure to radiation. The viscosity control agent is utilized to alter the viscosity of the photoinitiator and vehicle system. One of the primary reasons for adding a viscosity control agent to the photopolymerizable system is to change the viscosity of the system to meet certain processing standards. The viscosity control agent should also be solvent-free emitting essentially no vapors upon being subjected to radiation conditions.

The above described system can generally be referred to as photopolymerizable systems. When such systems are desired to be utilized as coatings on paper or metal, it is necessary, in most instances to add a pigment dye to the system to give it a desired color. Such dyes or pigment comprise a third component of the photopolymerizable system. The specific dyes or pigments which can be used in such a photopolymerizable system are well known in the art and will be further described below.

Many prior art systems are basic two component systems which are said to be easily formulated and utilized. However, because of such simplicity, they have distinct disadvantages when used as coatings. Typical of such prior art systems are those containing a vehicle comprising at least one ester of an unsaturated acid and a polyhydric alcohol and a photoinitiator which comprises a halogenated hydrocarbon.

As mentioned above, such systems are relatively simple since they only comprise essentially two components but, however, these rather simple systems have many limitations. One of the difficulties with such systems is that upon exposure to radiation they are not fully polymerized remaining slightly tacky which results is a very poor wet rub resistance of the cured composition. Other disadvantages with such systems include relatively poor gloss and toughness after cure.

One of the primary disadvantages associated with poor wet rub resistance of cured coatings when used in the printing industry is that they can be easily damaged by subsequent handling or processing. In particular, when the partially cured substance is exposed to subsequent printing operations, to stacking or to labeling operations it can easily be rubbed off or be permanently blemished, and in many instances to such an extent as to require rejecting of the printed material.

In many instances toughness of such systems are inferior which is the direct result of the poor wet rub resistance of such systems. In other instances the gloss is rather poor which requires the addition of an overcoat layer of a lacquer or other similar substance to enhance the gloss properties of the printed surface.

The present improvement comprises adding to the system described above a material comprising an unsaturated hydroxyl containing polymeric hydrocarbon. Such material substantially improves the wet rub resistance, gloss and toughness of prior art systems. In a particular instance, the improvement claimed herein comprises adding to the prior art systems a material produced from the reaction product of a vinyl aromatic and an unsaturated alcohol.

The polymerizable compounds which comprise the vehicle and which are usable in the present invention are generally selected from suitable monomers, copolymers or pre-polymers or mixtures thereof. Particularly usable, are the free-radical polymerizable unsaturated compounds generally characterized as vinyl containing esters. They are generally produced through the reaction of an unsaturated acid such as acrylic acid and a polyhydric alcohol. Specific examples are the esters of such polhydric alcohols as pentaerythritol, dipentaerythritol, polypentaerythritols, etc. Other esters may be produced using other polyhydric alcohols known in the art.

The unsaturated organic acid is preferrably acrylic acid but may be any homologue of acrylic acid or other unsaturated organic acid material which can be reacted with the polhydric alcohol to form the resulting described ester material. Such acids include methacrylic acid, methyl methacrylic acid, ethyl methacrylic acid, etc. Examples of usable esters include: pentaerythritol diacrylate; pentaerythritol triacrylate; dipentaerythritol triacylate; pentaerythritol tetracrylate; dipentaerythritol diacrylate; dipentaerythritol tetracrylate; dipentaerythritol pentacrylate; dipentaerythritol hexacrylate; tripentaerythritol octoacrylate; pentaerythritol dimethacrylate; pentaerythritol trimethacrylate; dipentaerythritol dimethacrylate; dipentaerythritol tetramethacrylate; tripentaerythritol octomethacrylate and so on. Mixtures of the above esters may also be used.

The above defined esters should be present from about 25 to about 75 weight percent of the photosensitive resin system. In a preferred instance the composition contains from about 25 to about 50 weight percent of the resin system.

The photoinitiators which function to form free-radicals upon exposure to radiation generally comprise a halogenated hydrocarbon and include a sensitizer. The halogenated hydrocarbon generally consists of aromatic hydrocarbons, alicyclic hydrocarbons, aliphatic hydrocarbons or esters such as aromatic esters, alicyclic esters, or aliphatic esters. The former grouping generally comprises halogenated paraffins while the latter materials are generally halogenated waxes. The halogenated hydrocarbons or esters can be mixtures or pure components of single species of the above recited classifications. Preferably the halogen atoms are directly attached to the ring structure in the aromatic and alicyclic compounds and are attached to the alpha carbon chain in the aliphatic compounds. The halogen may be chlorine, bromine, fluorine or iodine. The quantities of the photoinitiators present can vary from about 1 to about 35 weight percent of the photosensitive resin system as claimed.

Suitable halogenated hydrocarbons or waxes include for example, chlorinated rubbers such as the Parlons from Hercules Powder Company; copolymers of vinyl chloride and vinyl isobutyl ether, such as Vinoflex MP-400 from BASF Colors and Chemicals, Inc.; chlorinated aliphatic waxes such as Chlorowax 70 from Diamond Alkali, Inc.; Perchloropentylcyclodecane such as Dechlorane from the Hooker Chemical Co.; chlorinated paraffins such as Chlorafin 40 from the Hooker Chemical Co.; and Unichlor-70B from the Neville Chemical Co.; mono- and polychlorobenzenes, mono- and polybromobenzenes; mono- and polychloroxylenes; mono- and polybromoxylenes; dichloromaleic anhydride; 1-chloro-2-methyl naphthalene; 2,4-dimethylbenzene sulfonyl chloride; 1-bromo-3-(m-phenoxy benzene); 2-bromoethyl methyl ether; chlorendic anhydride; as well as fluorinated waxes such as Polymist F-7 from Allied Chemical. The above grouping is not an exclusive listing of halogenated materials which can be used as part of the photoinitiator component in the composition as claimed. Other materials, well known in the art, can be included as the photoinitiator component of the appended claims.

Also included within the broad definition of photoinitiators is the sensitizer component. In many cases the sensitizers also perform essentially the same roll as the above photoinitiators, that is, form free-radicals when exposed to radiation. In other instances, the sensitizers also function to render the photoinitiator component responsive to a broader segment of the radiation spectrum. Such sensitizers can be selected from well known materials such as; benzoins, benzils, benzophenones or benzoin ethers. In particular, Michler's ketone and benzoin isobutyl ether are particularly suitable for use in sensitizers in the present combination. Other particular sensitizers which may be used include Trigonal 14, Benzoin Methyl Ether, etc.

The sensitizers can be present either in mixtures or as relatively pure components. Their presence is generally anywhere from about 2 to about 15 weight percent of the photosensitive resin system.

Prepolymers may be added to the resin system to react with the above photopolymerizable components in the presence of oxygen. They also result in a tough, more flexible surface cure of the film. The prepolymer materials may be present as anywhere from about 3 to about 15 weight percent of the photosensitive resin system claimed.

Prepolymers such as diallyl phthalate may be added to the claimed composition of the vehicle. Other prepolymers having similar characteristics may be used and can include polyester resins which are compatible with acrylic monomers and which will co-react with the monomer to form a homogeneous system. Still other prepolymers include such materials as diallyl isophthalate, diallyl terephthalate, triallyl cyanurate, triallyl mellitate, tetraallyl pyromellitate and similar compounds. Actomer S-7380 made by Union Carbide Corp. may also be used as a prepolymer.

Viscosity control agents such as acrylic monomers may be used to slightly alter the flow characteristics and viscosity of the claimed composition. The viscosity control agents are typically monomers and preferably comprise vinyl monomers which are capable of reacting with acrylic monomers so as to provide desired properties in the cured resin system. The vinyl monomer can include such materials as Cellosolve acrylate, methyl Cellosolve acrylate, butyl Cellosolve acrylate, neopentyl glycol diacrylate, dicyclo pentenyl acrylate, 2-(N,N-diethylamino) ethyl acrylate, methyl methacrylate, styrene, 2-methyl styrene, ethyl acrylate, m-butyl acrylate, 2-ethylhexyl acrylate, isodecyl acrylate, etc.

The viscosity control agents should be selected for low volatility and vapor pressures so as to prevent solvent loss or release to the atmosphere. Such reduction or elimination of solvent loss is one of the primary advantages for utilizing the claimed compositions because of the present emphasis on elimination of all forms of atmospheric emissions which would cause pollution.

The above viscosity control agents can be present from anywhere from about 1 to about 12 weight percent of the photosensitive resin system.

The present improved photosensitive resin system can be preferably utilized as a printing ink which upon exposure to ultraviolet radiation becomes cured instantaneously. In using such composition as an ink, it is contemplated that various pigments or dyes can be incorporated therein. Depending upon the density of color or the particular color needed, pigment or dye concentration can vary anywhere from about 5 to about 60 weight percent of the photosensitive resin system. Of course, this range of pigment or dye concentrations is very much dependent upon the type of pigment used.

Specific pigments which can be utilized include such materials as benzidine yellow, milori blue, phthalocyanine blue, molybdate orange, titanium white, chrome yellow, carbon black, as well as color dyes. Other organic or inorganic pigments or dyes may be utilized which are well known in the printing ink art. No particular pigment or dye is attributed to by applicants as being of a patentable significance.

The component which renders the claimed composition improved over the art comprises an unsaturated hydroxyl containing polymeric hydrocarbon material. More particularly, this material is a copolymer of an unsaturated hydrocarbon and an unsaturated alcohol. Preferably, this material is a copolymer of a vinyl aromatic and allyl alcohol. The unsaturated alcohol preferably should have anywhere from about 2 to about 10 carbon atoms per molecule while the vinyl aromatic is typically styrene. In a most preferred instance, the improved composition utilizes a copolymer of styrene and an unsaturated alcohol which has three carbon atoms per molecule. A material produced by the Monsanto Company and sold under the trade name "RJ 100" is especially preferable as the improved addition to the claimed composition.

The source of radiation used to cure the claimed photosensitive resin system preferably emits an ultraviolet spectrum. In one instance an ultraviolet source such as the "PARS" unit produced by Union Carbide is especially preferred for curing compositions herein. Other ultraviolet light sources such as high pressure mercury are quartz ultraviolet lamps produced by Hanovia also work well. The Hanovia lamp units produce large quantities of heat energy providing a thermal cure in addition to a true ultraviolet energy cure for the claimed composite.

The preferred source for radition curing our claimed compositions is produced by the Union Carbide Corporation and referred to as a "PARS" unit. These particular units will cure the present claimed composition with essentially no heat liberated since these particular radiation units are based on plasma arc radiation principles. Accordingly, the "PARS" unit is preferable to other type radiation sources for curing the claimed composition. Since the claimed composition can be cured without relying on heat, which is provided from most conventional radiation sources, it provides an additional benefit over prior art compositions.

Many prior art compositions rely on the thermal radiation of radiation sources for a substantial portion of their cure. In many instances the present claimed composition can be cured in the absence of thermal radiation and generally at a temperature of less than 120° F. Most preferably, the claimed composition can be cured with radiation without having to be increased over normal ambient temperatures.

The composition, as claimed, is preferably produced by reacting a vinyl aromatic and an unsaturated alcohol together with isobutyl ether at the temperatures above around 240° C. for sufficient period of time to allow a copolymer to form. Thereafter, the mixture is cooled, preferably to around 180° C. for addition of one or more of the halogenated hydrocarbons making up the photoinitiator. The material can then be cooled to around 150° C. for addition of the sensitizer, preferably Michler's Ketone, and addition of a viscosity modifying agent, typically a vinyl monomer capable of reacting with an acrylic monomer and more particularly an acrylate material.

In a separate procedure and preferably at a reduced temperature, pentaerythritol triacrylate and the optional prepolymer such as diallyl phthalate are mixed together. This mixture is then combined with the above described mixture preferably at ambient temperatures. Thereafter, other photoinitiators and dyes or pigment can be added and the entire mixture passed through a three roll mill or other similar processing units to disperse the pigment and other components.

The above procedure is preferred method of producing composition as claimed. However, where individual elements of the claimed composition are substituted with products having substantially different boiling points, reaction temperatures, viscosities, etc., the above procedure can be modified by one skilled in the art to take into account the different physical and chemical properties of the different materials utilized.

The example presented below represents preferred embodiments of the present invention should not be utilized to unduly limit the scope of the claims attached.

EXAMPLES

Two radiation curable ink materials wwere produced having substantially similar compositions except that one of the examples was produced utilizing the claimed and preferred improvement—namely, the copolymer of a vinyl aromatic and unsaturated alcohol—to illustrate the benefits accompanying the claimed improvement.

The materials as listed in the table below are for the most part readily available to those skilled in the art. The Trigonal 14 produced by the Noury Chemical Company is essentially an isobutyl ether of benzoin. The vinyl aromatic—unsaturated alcohol copolymer utilized in Example 2 below was essentially a copolymerized product of styrene and an unsaturated alcohol having three carbon atoms per molecule.

The two examples were prepared in substantially identical procedures. In example 1 the Trigonal 14 was reacted at 240° C. for a sufficient time for the desired reaction to take place. Thereafter, the mixture was cooled to approximately 150° C. and the Michler's Ketone and trimethylolpropane triacrylate were mixed together.

In a separate procedure the pentaerythritol triacrylate and the diallyl phthalate prepolymer were mixed together at ambient temperatures. Thereafter, the above two mixtures were combined with phthalocyanine blue added to the combined product. The material was then placed in a three roll mill for sufficient time to blend the ingredients.

In Example 2 the same procedure was used except that the copolymer of a vinyl aromatic and an unsaturated alcohol and the Trigonal 14 were intially reacted at 240° C. and thereafter blended with the remaining components as previously described.

The two examples produced did not contain the halogenated hydrocarbon photoinitiator. The absence of this material, however, will not prevent a valid comparison of the two compositions since the addition of the halogenated material to each would affect them identically.

The two compositions were placed upon printing sheets at approximately identical thicknesses through the use of a rubber roller. They were exposed through the "PARS" unit produced by Union Carbide Corporation at linear rate of approximately five hundred feet per minute of printing paper passing under the radiation unit. The curing took place in an atomspheric environment. The differences of the two examples after identical curings are obvious.

The material produced in Example 1 which does not contain the copolymer of a vinyl aromatic and an unsaturated alcohol had noticeably inferior gloss as compared to the material of Example 2. Additionally, the rub resistance tested immediately after passage through the "PARS" unit was noticeably improved for Example 2. Actually rubbing each of the examples immediately after they had passed through the radiation unit showed that the composition of Example 1 rubbed off of the paper while composition of Example 2 did not rub off.

The compositions of the two materials produced, described, and tested above are shown in the table on the following page.

| COMPONENT DESCRIPTION | PARTS BY WEIGHT Ex. I | PARTS BY WEIGHT Ex. II |
| --- | --- | --- |
| Pentaerythritol Triacrylate (Celanese) | 53.3 | 51.4 |
| Diallyl Phthalate (Pre-Polymer) (F.M.C.) | 13.3 | 12.8 |
| Trigonal 14 (Noury Chemicals) | 15.0 | 9.0 |
| Michler's Ketone (Eastman Kodak) | 5.6 | 3.4 |
| Trimethylolpropane Triacrylate (Sartomer) | 11.0 | 6.6 |
| Phthalocyanmine Blue (Norton) | 12.7 | 12.5 |
| Vinyl aromatic-unsaturated alcohol copolymer | — | 13.6 |
| TOTAL | 110.9 | 110.3 |

We claim as our invention:

1. An improved photosensitive resin system ink which is essentially solvent-free and which comprises: pigment; between about 25 and about 75 weight percent of an ester of an ethylenically unsaturated organic acid and polyhydric material selected from the group consisting of pentaerythritol, dipentaerythritol, and polypentaerythritol; between about 1 and about 35 weight percent of a photoinitiator selected from the group consisting of halogenated paraffins and esters and containing a sensitizer selected from the group consisting of Michler's ketone and benzoin ethers; and between about 5 and about 35 weight percent of a copolymer of styrene and an unsaturated alcohol having 3 carbon atoms, the relative amounts of said styrene and said unsaturated alcohol in the copolymer being sufficient to provide improved wet rub resistance, gloss and toughness to the resin system ink when cured.

2. The improved photosensitive resin system ink of claim 1, further including a viscosity control agent selected from the group consisting of Cellosolve acrylate and trimethylol propane triacrylate.

3. The improved photosensitive resin system ink of claim 1, wherein said copolymer comprises a copolymer of styrene and allyl alcohol.

4. The improved photosensitive resin system ink of claim 1, wherein said ethylenically unsaturated organic acid is acrylic acid.

5. An essentially solvent-free photosensitive resin system ink curable by exposure to radiation, comprising:
(a) a pigment;
(b) from about 25 to about 75 weight percent of an ester of an ethylenically unsaturated organic acid and an aliphatic polyhydric alcohol;
(c) from about 1 to about 35 weight percent of a photoinitiator;
(d) from about 1 to about 12 weight percent of an acrylic monomer viscosity control agent; and
(e) from about 5 to about 35 weight percent of a copolymer of styrene and an unsaturated alcohol having 3 carbon atoms, the relative amounts of said styrene and unsaturated alcohol in said copolymer being sufficient to provide improved wet rub resistance, gloss and toughness of the cured resin system ink.

6. The photosensitive resin system of claim 5, wherein said organic acid is acrylic acid.

7. The photosensitive resin system of claim 5, wherein said aliphatic polyhydric alcohol is selected from the group consisting of pentaerythritol, dipentaerythritol, and polypentaerythritol.

8. The photosensitive resin system of claim 5, wherein said copolymer is a copolymer of styrene and allyl alcohol.

9. The improved resin system ink of claim 1, wherein said sensitizer is present in an amount of from about 2 to about 15 weight percent, based on the total weight of the resin system ink.

* * * * *